US007804872B2

United States Patent
Morizumi

(10) Patent No.: US 7,804,872 B2
(45) Date of Patent: Sep. 28, 2010

(54) NITRIDE SEMICONDUCTOR LASER ELEMENT

(75) Inventor: Tomonori Morizumi, Anan (JP)

(73) Assignee: Nichia Corporation, Anan-shi (JP)

( * ) Notice: Subject to any disclaimer, the term of this patent is extended or adjusted under 35 U.S.C. 154(b) by 31 days.

(21) Appl. No.: 12/132,880

(22) Filed: Jun. 4, 2008

(65) Prior Publication Data

US 2008/0304530 A1    Dec. 11, 2008

(30) Foreign Application Priority Data

Jun. 7, 2007 (JP) .............................. 2007-151636
May 12, 2008 (JP) .............................. 2008-124130

(51) Int. Cl.
   *H01S 5/00* (2006.01)
(52) U.S. Cl. ................... 372/49.01; 372/43.01
(58) Field of Classification Search ............. 372/49.01, 372/43.01
   See application file for complete search history.

(56) References Cited

U.S. PATENT DOCUMENTS

2007/0025231 A1   2/2007   Ochiai et al.

2007/0205424 A1*  9/2007   Kamikawa et al. ............ 257/94

FOREIGN PATENT DOCUMENTS

| JP | H09-162497 A | 6/1997 |
|----|---|---|
| JP | H09-283843 A | 10/1997 |
| JP | 2002-329926 A | 11/2002 |
| JP | 2002-335053 A | 11/2002 |
| JP | 2006-024703 A | 1/2006 |
| JP | 2006-228892 A | 8/2006 |
| JP | 2007-059897 A | 3/2007 |

* cited by examiner

Primary Examiner—Tod T Van Roy
(74) Attorney, Agent, or Firm—Global IP Counselors, LLP

(57) ABSTRACT

A nitride semiconductor laser element comprises; a nitride semiconductor layer that includes a first nitride semiconductor layer, an active layer, and a second nitride semiconductor layer, and that has a cavity with end faces, and a first protective film that is in contact with at least one end face of the cavity, wherein the first protective film has a film structure in which bright and dark parts comprising a region in contact with the active layer and a region in contact with the first and second nitride semiconductor layers are observed under scanning transmission electron microscopy, or the first protective film has a film structure in which the crystallinity at a portion adjacent to the active layer is different from that at portions adjacent to the first and second nitride semiconductor layers.

21 Claims, 6 Drawing Sheets

NITRIDE SEMICONDUCTOR LASER ELEMENT

BACKGROUND OF THE INVENTION

1. Field of the Invention

The present invention relates to a nitride semiconductor laser element, and more particularly relates to a nitride semiconductor laser element having a protective film on an end face of the cavity.

2. Background Information

With a nitride semiconductor laser element, end faces of the cavity formed by RIE (reactive ion etching) or cleavage has a narrow bandgap energy, so absorption of the exiting light occurs at the end face, this absorption generates heat at the end face, and problems such as a short service life are encountered in trying to obtain a high-output laser. Consequently, there has been proposed, for example, a method for manufacturing a high-output semiconductor laser in which a silicon oxide or nitride film is formed as a protective film on the cavity end face (see, for example, Japanese Laid-Open Patent Application H9-283843).

Meanwhile, conventional nitride semiconductor laser elements have employed a method in which the thickness of the protective film formed on the cavity end face is varied according to the density of the emitted light in order to suppress variance in device characteristics from chip to chip (see, for example, Japanese Laid-Open Patent Application 2006-228892). Also, it has been proposed that a stripe structure is employed inside the cavity, unimodality of FFP (Far Field Pattern) is achieved, for example, an $SiO_2$ film is used as a protective film, and the thickness of the protective film is varied for each stripe (see, for example, Japanese Laid-Open Patent Application 2002-329926).

A method has been proposed for forming an end face coating film via an adhesive layer on a cavity end face in order to suppress the end face deterioration in nitride semiconductor laser elements (see, for example, Japanese Laid-Open Patent Application 2002-335053).

However, as the output of semiconductor lasers has risen, there has been a need for further improvement to structures related to the exit of light from a cavity end face. That is, there is a need for a structure with which the adhesion of the protective film is maximized without imparting stress to the active layer, for example, according to the performance, etc., thereof, while still being able to prevent degradation of the protective film during drive of the laser element.

Also, there is increasing demand for nitride semiconductor laser elements that are compact and have low output, which are used to reproduce next-generation optical disks. As the reflectance of the cavity end face of a nitride semiconductor laser element rises, the load on the cavity end face becomes large despite the low output. Consequently, just as with a high output semiconductor laser, there is need for improvement to the structure related to the exit of light from the cavity end face.

SUMMARY OF THE INVENTION

The present invention was conceived in light of the above problems, and it is an object thereof to provide a nitride semiconductor laser element with which there is reduced stress load on the active layer, which prevents the degradation that would otherwise result in the laser element during drive, and with which good adhesion of the protective film to the cavity end face is ensured due to the reduction in stress, and the performance of the laser element itself can be enhanced.

The present invention provides a nitride semiconductor laser element comprising a nitride semiconductor layer that includes a first nitride semiconductor layer, an active layer, and a second nitride semiconductor layer, and that has a cavity with end faces, and a first protective film that is in contact with at least one end face of the cavity, the first protective film has a film structure in which bright and dark parts comprising a region in contact with the active layer and a region in contact with the first and second nitride semiconductor layers are observed under scanning transmission electron microscopy.

Further, the present invention provides a nitride semiconductor laser element comprising a nitride semiconductor layer that includes a first nitride semiconductor layer, an active layer, and a second nitride semiconductor layer, and that has a cavity with end faces, and a first protective film that is in contact with at least one end face of the cavity, the first protective film has a film structure in which the crystallinity at a portion adjacent to the active layer is different from that at portions adjacent to the first and second nitride semiconductor layers.

With the present invention, it is conceivable that the first protective film may have a film structure in which bright and dark parts are observed in the region in contact with the active layer and in the region in contact with the first and second nitride semiconductor layers in observation by scanning transmission electron microscopy, that is, in which the crystallinity is different in the region in contact with the active layer of the first protective film and in the region in contact with the first and second nitride semiconductor layers of the first protective film. If bright and dark parts are thus visible in the first protective film, that is, if the crystallinity is made different in the above-mentioned regions, the first protective film will produce less stress around the active layer at the cavity end face. This ensures that the first protective film will adhere well to the cavity end face, and also prevents degradation of the laser element during drive. As a result, stable operation can be ensured, and it is possible to provide a nitride semiconductor laser element with higher reliability and an increased COD (Catastrophic Optical Damage) level.

DETAILED DESCRIPTION OF THE PREFERRED EMBODIMENTS

Figure 1:
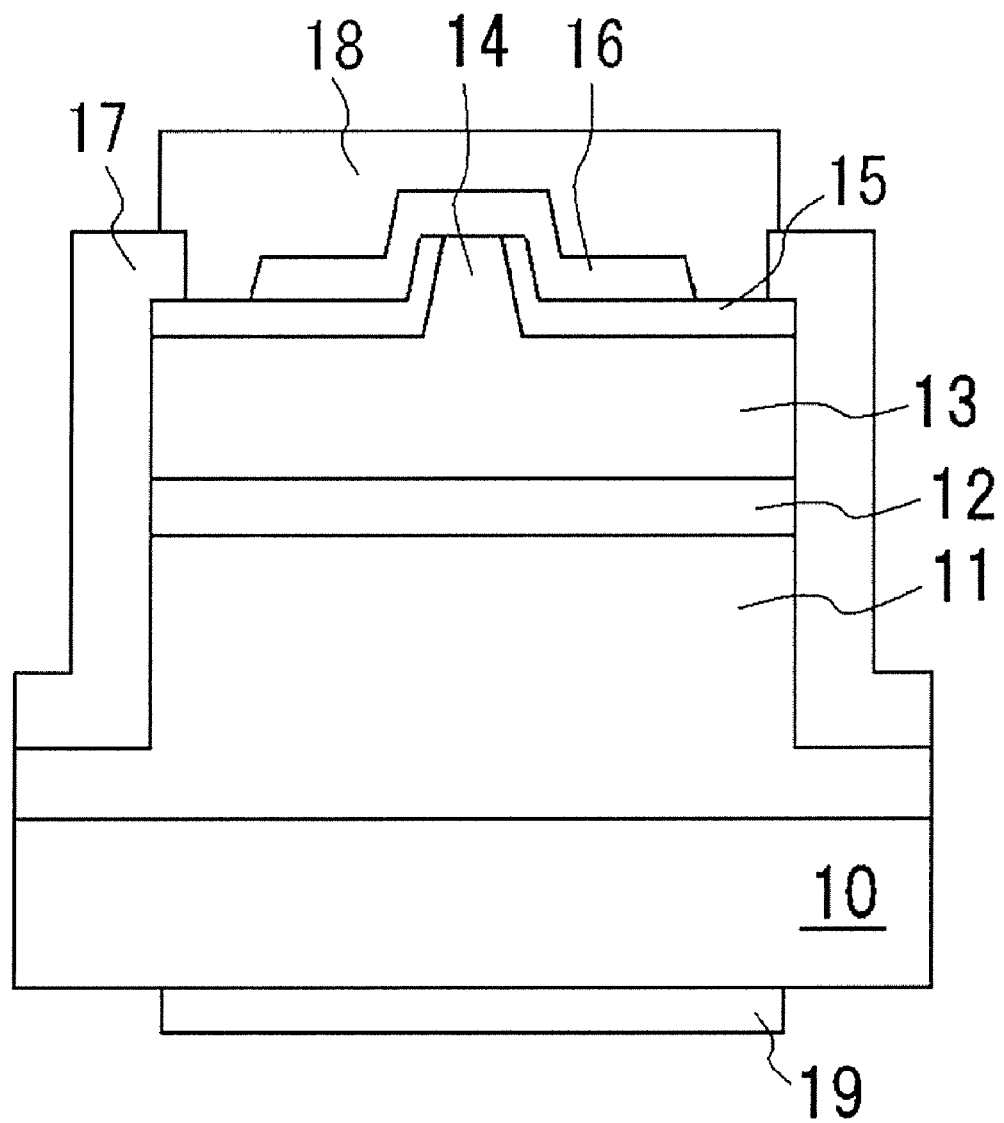
FIG. 1 is simplified cross section illustrating the structure of the laser elements of the present invention.
Figure 2A:
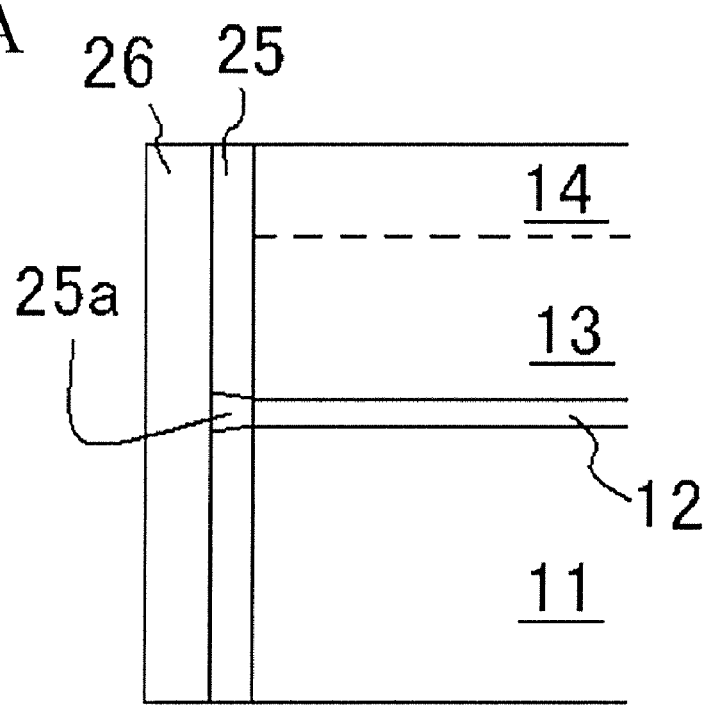
FIG. 2A is simplified cross section illustrating the structure of the protective film of the present invention.
Figure 2B:
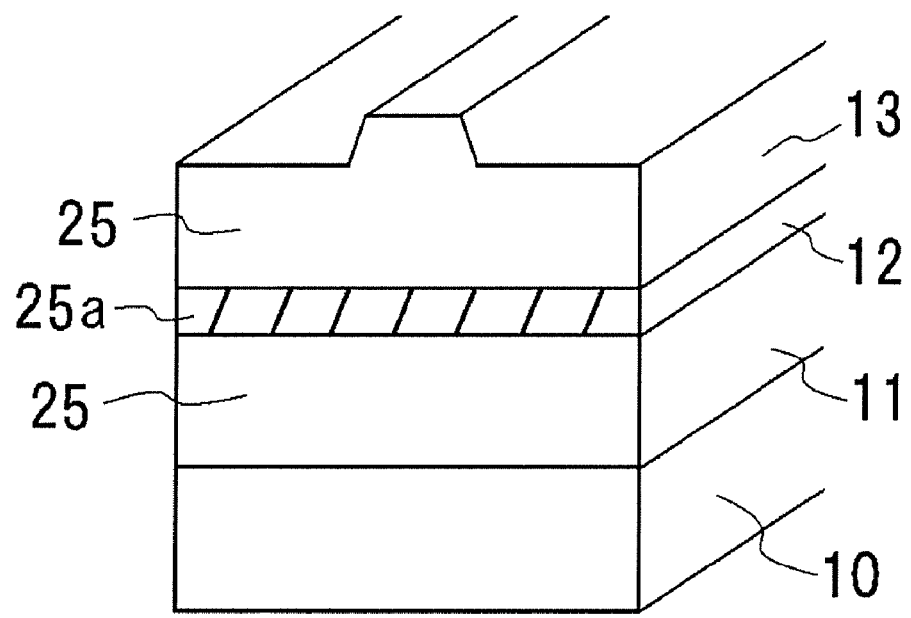
FIG. 2B is an oblique perspective view illustrating the structure of the laser elements of the present invention.

As typically shown in FIGS. 1, 2A and 2B, for example, the nitride semiconductor laser element of the present invention mainly includes a first nitride semiconductor layer 11, an active layer 12, and a second nitride semiconductor layer 13, and cavity is formed by setting cavity end faces on opposed end faces of the nitride semiconductor layer.

This nitride semiconductor laser element is usually formed on a substrate 10, a ridge 14 is formed on the surface of the second nitride semiconductor layer 13, and a first protective film 25 is formed on whole end faces of the cavity in contact with the end faces, a second protective film 26 is formed on the first protective film 25. Further, an embedded film 15, a p-electrode 16, a third protective film 17, p-pad electrode 18, an n-electrode 19, and so forth are formed. In this application, protective films formed on and above the cavity end faces such as the first protective film and the second protective film will be collectively referred to as a "protective film".

The first protective film may be a film composed of oxides of Si, Mg, Al, Hf, Nb, Zr, Sc, Ta, Ga, Zn, Y, B, Ti, etc., especially Ale, $SiO_2$, $Nb_2O_5$, $TiO_2$, $ZrO_2$, etc., nitrides such as AlN, AlGaN, GaN, BN, SiN, etc. or fluorides and the like, or a combination of two or more thereof. Among these, oxides are preferable. From another standpoint, the first protective film is preferably formed from a material with no absorption with respect to the oscillation wavelength of the laser element.

There are no particular restrictions on the thickness of the first protective film, but the thickness is suitably 3 nm to 1000 nm, 5 nm to 700 nm, and preferably 10 nm to 400 nm.

The first protective film covers the cavity end faces formed on the nitride semiconductor layer, but does not necessarily have to cover the entire cavity end faces, and may cover at least the optical waveguide region (including the active layer and a region partially above and below thereof) of the cavity end face. Also, the first protective film may partially cover a face other than the cavity end face.

The first protective film may have monocrystalline, polycrystalline structure, or the like. Examples of the crystal structure of the first protective film include hexagonal system, cubic system, and rhombic system, or the like. The material, crystallinity, or orientation of the first protective film can be selected according to the material, crystallinity, or orientation of the cavity end face to be formed the first protective film formed on the cavity end face. When the first protective film of the present invention has a hexagonal crystal structure, it is preferably a film oriented along the M axis <1-100>, the A axis <11-20>, the C axis <0001>, the R axis <1-102>, etc., and that is oriented along the same axis as the cavity end face. The reason for this is that forming a first protective film having a crystal structure with the same axial orientation as the cavity end face is believed to prevent degradation of the cavity end face by widening the band gap energy of the cavity end face and forming a window structure.

The crystal structure of the present invention need not necessarily be a monocrystal or polycrystal in a strict sense, and may instead be a crystal structure that is close to these, or a crystal structure that exhibits the characteristics of these crystal structures. Also, the first protective film with good crystallinity can be formed if the lattice constant is close to that of the nitride semiconductor (for example, the difference from the lattice constant of the nitride semiconductor is no more than 15%). This improves the quality of the first protective film, reduces stress so as to prevent cracking in the nitride semiconductor layer during drive of the semiconductor laser element, and reliably increases the COD level. In other words, if the structure is in a polycrystalline state or includes a polycrystal, a difference in lattice constant from that of the cavity end face will not appear in the strictest sense, and this difference can be reduced.

Among these, the first protective film is preferably formed by a material having a hexagonal crystal structure, and more preferably formed by a material having a hexagonal crystal structure and has M axis orientation. The phrase "M axis orientation" here is not strictly limited to only a state in which a monocrystal is oriented along the M axis, and may encompass a state in which polycrystallines are also present, but site (also, portion(s) or part(s)) oriented along the M axis are included uniformly, or a state in which these are uniformly dispersed.

The state of a film is generally classified as monocrystalline, polycrystalline, or amorphous, depending on the degree of crystallization of the material that makes up the film. Monocrystallines have almost no variation in lattice constant among materials, and there is almost no lattice plane inclination. To put this another way, the atoms in the material are arranged in a regular pattern, and order is maintained over an extended distance. Polycrystallines are made up of numerous microscopic monocrystallines, i.e., microcrystallines. An amorphous material is one that has no periodic structure such as that in a crystal, that is, it means that the atomic arrangement is irregular and there is no order over an extended distance.

The state of the film (crystalline or a crystal state in the case of a crystal substance) can be easily evaluated from a diffraction image produced by electron beam. That is, an electron beam is directed at the film, and an electron beam diffraction image appears corresponding to the planar direction and the size of the lattice constant. For instance, in the case of a monocrystalline, since the crystal planes are almost aligned, the diffraction points are observed to aligned with good regularity. In the case of a polycrystalline, since it is made up of microcrystals, the lattice planes are not all facing the same way, and the diffraction points may come together in a complex fashion, or Debye rings may be seen. In the case of an amorphous material, meanwhile, since the atomic arrangement does not have a periodic structure over an extended distance, no electron beam diffraction occurs. Therefore, this is observed as a state in which the diffraction image has no diffraction points.

An electron beam diffraction image can be observed by cutting the protective film so that a cross section is exposed with respect to the end face where the protective film is formed, and directing an electron beam at this cross section. The electron beam diffraction image observation can be carried out, for example, using a JEM-2010F made by JEOL.

With this first protective film 25, scanning transmission electron microscopy reveals bright and darks parts between a region 25a substantially in contact with an active layer 12 (may be a nearby region) and a region substantially in contact with the other layers, namely, a first nitride semiconductor layer 11 and a second nitride semiconductor layer 13. The phrase "substantially in contact" here means not only that the first protective film is in direct contact with the cavity end face of the nitride semiconductor, but also that the first protective film may be formed over another thin film formed on the cavity end face, as long as the effect of the present invention is preserved. For instance, a thin film may be present formed by pretreatment of the cavity end face or by means of the atmosphere at the start of film production.

In this Specification, a location extending in the total film thickness direction and including the region of the first protective film in contact with the active layer will sometimes be called a location adjacent to the active layer.

Also, the region 25a in contact with the active layer 12 (may be a nearby region) and the region in contact with the first nitride semiconductor layer 11 and the second nitride semiconductor layer 13 may be formed from substantially the same material. It is acceptable for there to be slight differences in the composition of the two due to the manufacturing method and so forth.

The bright and dark parts observed in the first protective film formed from the same material are believed to be attributable to differences in the crystalline state of the first protective film 25. These differences in the crystalline state not only appear as bright and dark parts under scanning transmission electron microscopy, but can also be confirmed by electron beam diffraction or another such method, as discussed below. In other words, saying that the crystallinity is different means that a difference will be observed in scanning transmission electron microscopy, electron beam diffraction, etc.

Therefore, this can be rephrased by saying that the crystallinity is different between the region 25a in contact with the active layer 12 and the region in contact with the first nitride semiconductor layer 11 and the second nitride semiconductor layer 13, or between the location extending in the thickness direction of the first protective film adjacent to the active layer 12 and the location extending in the thickness direction of the first protective film adjacent to the first nitride semiconductor layer 11 and the second nitride semiconductor layer 13. However, there is a region in which this crystallinity changes smoothly within the region in contact with the active layer or above and below the region in contact with the active layer. Within the region 25a in contact with the active layer, the region of different crystallinity (the bright part or dark part) may be discontinuous, or the region of different crystallinity may be divided into sections.

When the first protective film thus has a structure in which bright and dark parts are observed in scanning transmission electron microscopy, or in which the crystallinity is different near the active layer, it is surmised that stress produced in the interior of the first protective film by differences in the coefficient of thermal expansion, lattice constant, etc., from those of the cavity end face can be effectively reduced in a first protective film formed in contact with substantially the entire cavity end face of the nitride semiconductor layer, and that adhesion of the first protective film in contact with the active layer to the cavity end face can be increased.

The bright parts or dark parts of the region in contact with the active layer are preferably formed continuously in the thickness direction of the first protective film. This increases adhesion of the first protective film to the film formed over it (such as the second protective film discussed below), and reduces separation between the protective films.

Figure 3:
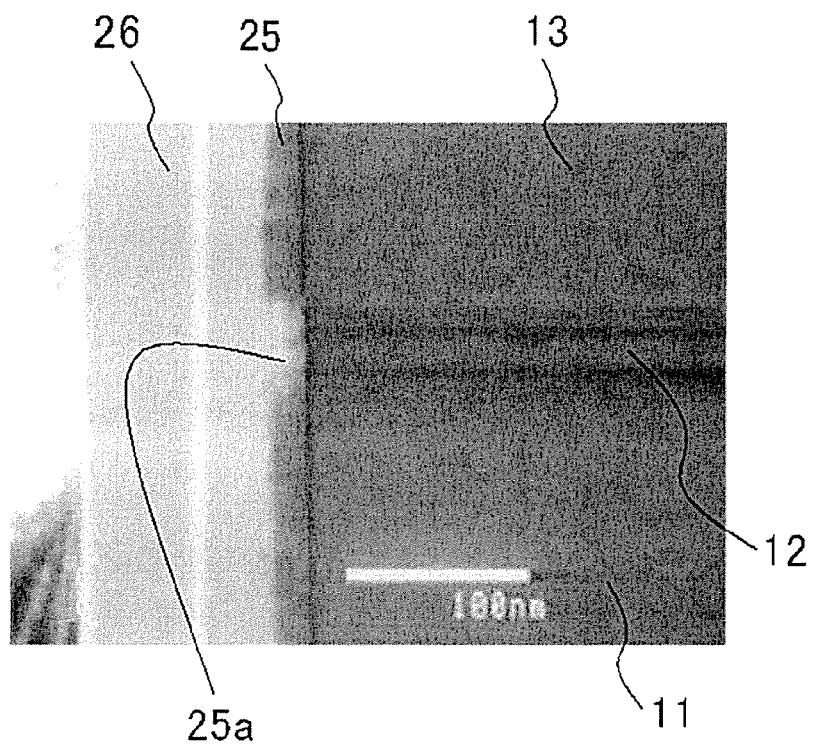
FIG. 3 is a STEM (scanning transmission electron microscope) image illustrating the protective film of the present invention.

Also, the region in contact with the active layer (the region with higher brightness in FIG. 3) may have a width that varies in the thickness direction of the first protective film. For instance, as shown in FIGS. 2A and 3, this region may be formed wider on the outside of the element than on the cavity end face side. Forming the region in this way causes the region in contact with the active layer (the region of different crystallinity) to be in contact with the second protective film over a larger surface area discussed below. As a result, adhesion is between the first protective film and second protective film, and separation between the protective films is reduced.

Figure 5A:
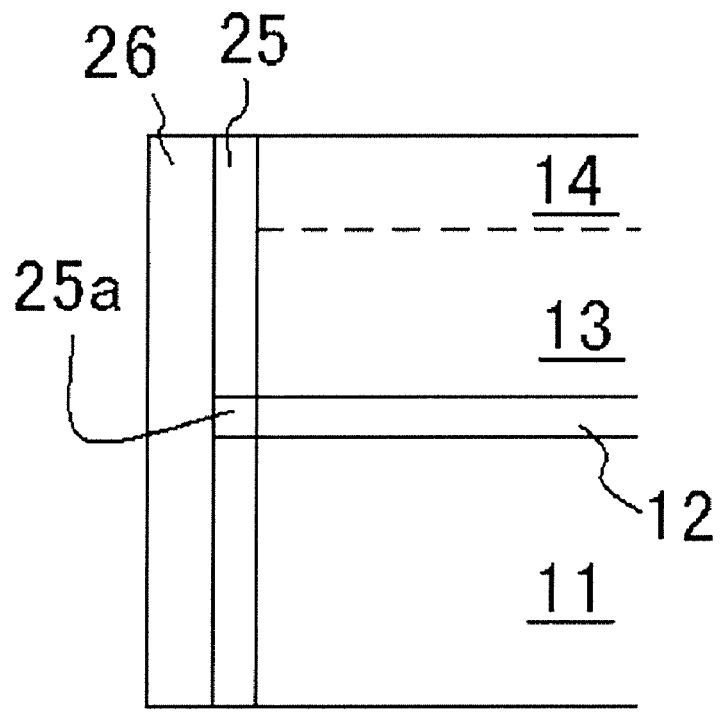
FIGS. 5A and 5B are simplified cross sections illustrating another structure of the protective films of the present invention.
Figure 5B:
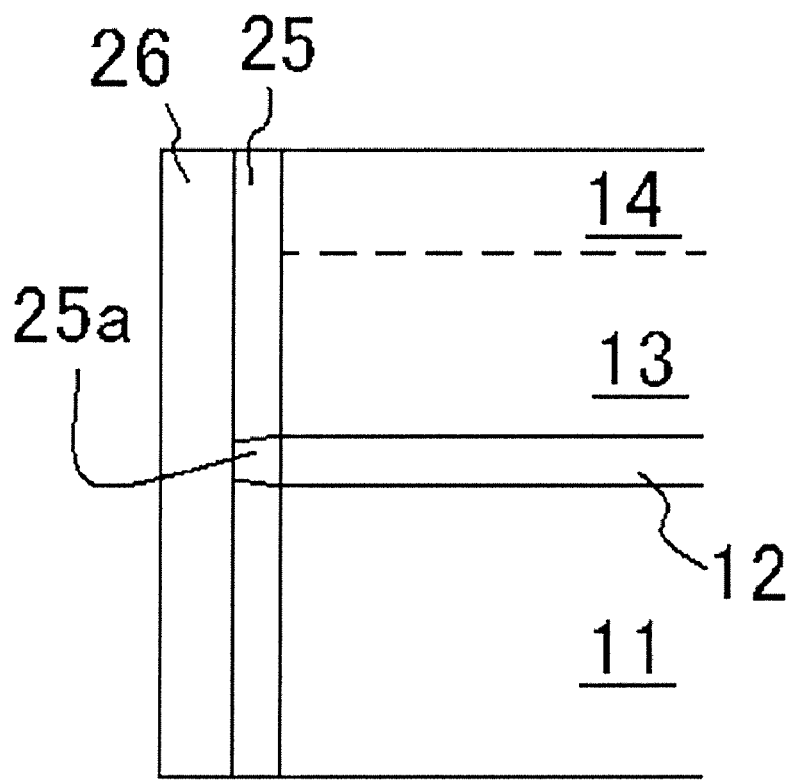

This in turn improves adhesion at the interfaces between the cavity end face and the first protective film and between the first protective film and the second protective film. As shown in FIG. 5A, this region may be formed substantially parallel to the film thickness of the active layer, or as shown in FIG. 5B, it may be formed narrower on the outside of the element than on the cavity end face side. With the first protective film formed at the cavity end face, a region in contact with the first nitride semiconductor layer and a region in contact with the second nitride semiconductor layer are disposed so as to sandwich the region in contact with the active layer. Therefore, the width of the region in contact with the first nitride semiconductor layer also varies according to the width of the region of the first protective film in contact with the active layer. The same applies to the region in contact with the second nitride semiconductor layer.

The crystallinity of the region in contact with the active layer and in the region in contact with the other layers may be either good or poor, but because of the composition of the semiconductor layer constituting the first nitride semiconductor layer and the second nitride semiconductor layer and the active layer, and other such factors, it is usually better for the crystallinity to be poor in the region in contact with the active layer. This will improve adhesion between the region of the first protective film in contact with the active layer and the active region, and will reduce stress at the cavity end face of the first nitride semiconductor layer and the second nitride semiconductor layer. Also, the difference in lattice constant between the material used for the active layer and the material used for the first protective film is usually greater than the difference in lattice constant between the material used for the first protective film and the material used for the first nitride semiconductor layer and second nitride semiconductor layer. Therefore, it is believed that the crystalline state of the first protective film in the region in contact with the active layer varies, and a region of different crystallinity tends to be formed.

The phrase "crystallinity is good" as used here refers to a state close to that of a monocrystal, that is, there is almost no fluctuation in the lattice constant within material, and there is almost no lattice plane inclination. The phrase "crystallinity is poor" refers to a state that is closer to polycrystalline or amorphous than a film serving as a source of comparison, and refers to a material made up more of microcrystals, or a material having no periodic structure such as that found in crystals.

There are no particular restrictions on the degree by which the crystallinity differs, but in the first protective film, for example, whereas the crystal structure of the region in contact with the first nitride semiconductor layer 11 and the second nitride semiconductor layer 13 is substantially monocrystalline or close to monocrystalline, the crystal structure of the region in contact with the active layer partially includes a polycrystalline or amorphous, or is a crystal structure close to polycrystalline or closer to amorphous. Alternatively, the crystallinity between the active layer and that of the first nitride semiconductor layer and second nitride semiconductor layer may be reversed.

That crystallinity is different can be confirmed not only by TEM (Transmission Electron Microscope), STEM, SEM (Scanning Electron Microscope), and other kinds of cross section observation, but also by electron beam diffraction described above or from the difference in the etching rate.

In other words, in observing a first protective film under a microscope, a difference between a region in contact with the active layer and a region in contact with the first and second nitride semiconductor layers can be visually ascertained, which is due to a difference in crystallinity.

In particular, in observation by STEM, TEM or the like, a contrast (bright and dark parts) is observed due to the different states of the film (crystalline or a crystal state in the case of a crystal substance).

For example, STEM observation such as that in FIG. 3 shows the brightness is higher going from monocrystalline, to polycrystalline, to amorphous, in increasing order. The difference between monocrystalline, polycrystalline, and amorphous in these microscope observations cannot actually be discerned distinctly as bright and dark parts. For example, when a film that is a mixture of monocrystals and polycrystals is observed, the brightness will be somewhere between that of monocrystals and polycrystals. There are also cases when the brightness varies gradually. In the present invention, according to the Munsell system of color, when the difference of one or more stages (preferably 2 stages or more, and more preferably 3 stages or more) are recognized in their brightness, it is considered to be the difference of a crystalline or a crystal state, when the difference within one stage are recognized in their brightness, it is considered to be substantially the same.

Also, even when a given film is observed, the bright and dark parts may appear to switch when the observation conditions (display settings of STEM image or TEM image) are changed.

More specifically, as shown in FIG. 3, bright and dark parts are observed in the region of the first protective film in contact with the active layer and in the region in contact with the first nitride semiconductor layer 11 and the second nitride semiconductor layer 13. The region in contact with the first nitride semiconductor layer 11 and the second nitride semiconductor layer 13 appears darker (lower in brightness), while the region in contact with the active layer appears brighter (higher in brightness).

STEM observation can be carried out, for example, using a JEM-2010F made by JEOL. Observation is conducted by the following procedure. First, a specimen is cut out by microprobing using a focused ion beam (FIB) machining apparatus (for example, SMI3050MS2 made by Seiko Instruments Inc.), and the specimen is subject to thin film working to obtain a thin film at least about 50 nm, followed by subjecting to FIB machining. Then, a STEM image as shown in FIG. 3 can be obtained by performing STEM observation with the dark field at an acceleration voltage of 200 V.

For example, as shown in FIG. 6, this can be measured by directing an electron beam at a nitride semiconductor laser element from the GaN (11-20) plane direction. How the elements that make up the crystals of the protective film are arranged can be grasped visually from the resulting electron beam diffraction image. Also, when the film in contact with the cavity end face and/or the film near the cavity end face is observed, the diffraction point of the GaN that makes up the nitride semiconductor layer is sometimes observed. In this case, diffraction point of the GaN is separated before analysis.

Furthermore, if the protective film thus obtained is immersed in a suitable etchant, such as an acid solution (for example, buffered hydrofluoric acid or the like) or alkali solution (for example, KOH or the like), a difference in crystallinity can be discerned from a difference in solubility (etching rate difference). In this etching, a material with poor crystallinity will be quickly dissolved or removed, while a material with good crystallinity will remain or be preserved.

These are not the only methods that can be used, and the crystallinity of a protective film can be evaluated using any known method.

As discussed above, degradation of the end faces can be reduced by forming on the cavity end face the first protective film with the same axial orientation as the cavity end face. However, with a nitride semiconductor laser element, it is usually difficult to form a first protective film with the same axial orientation as the cavity end face at a good level of crystallinity. Also, even if a first protective film is formed with good crystallinity, cracks tend to form in the first protective film because of the difference in lattice constant between the first protective film and the nitride semiconductor layer. Or, the stress thereof can make the first protective film susceptible to lifting or separation. Furthermore, with a laser element made from a nitride semiconductor, the optical density at the cavity end face is higher than with laser elements made from other materials. Consequently, a first protective film that is thin enough not to produce cracks and the like cannot adhere and diffuse heat sufficiently at the cavity end face. On the other hand, as discussed above, stress due to heat during the drive of a laser element can be reduced by having the crystallinity of the first protective film be different, and by having the crystallinity of the first protective film in the region in contact with the first nitride semiconductor layer and the second nitride semiconductor layer be better than the crystallinity of the first protective film in the region in contact with the active layer. As a result, cracking can be suppressing in the first protective film, good adhesion of the first protective film can be ensured at the cavity end face, and heat diffusion can be improved while keeping the COD level high.

The above problems can be avoided when a film with good adhesion (such as an amorphous film) is formed at the cavity end face, but a problem is that the first protective film reacts with the cavity end face at the interface between the first protective film and the cavity end face, optical absorption occurs at the cavity end face, and the COD level decreases. However, a decrease in COD level can be prevented by making the crystallinity different within the first protective film as in the present invention. Also, when stress caused by heat during drive can be reduced, cracking can be suppressed in the first protective film, good adhesion of the first protective film can be ensured at the cavity end face, and heat diffusion can be improved while keeping the COD level high.

The first protective film can be formed, for example, by a method that is known in this field. For instance, this can be vapor deposition, sputtering, reactive sputtering, ECR (electron cyclotron resonance) plasma sputtering, magnetron sputtering, ion beam assist deposition, ion plating, laser ablation, CVD (Chemical Vapor Deposition), spraying, spin coating, dipping, a combination of these two or more methods, a combination of these methods and at least one method of, all or partially, pretreatment, applying an inert-gas such as Ar, He, Xe, etc. or plasma, applying oxygen, ozone or plasma thereof, oxidation treatment (thermal treatment), exposure treatment and any of various other methods. If the combination is adopted, it may be unnecessarily to form and/or treat simultaneously or continuously, it may firstly form the film followed by treating it, and vice versa. Among these, it is preferably to adopt a combination of pretreatment and ECR plasma sputtering.

If an oxide film is formed as the first protective film, it is preferably to adopt oxide or ozone for a pretreatment, if a nitride film is formed as the first protective film, it is preferably to adopt nitrogen for a pretreatment.

In particular, as the first protective film, to obtain a film disposed in the same crystal axial direction as the crystal axial direction in which the cavity end face is oriented, described above, although it will depend on the film formation method, it is preferable to control film formation by subjecting the cavity end face to an oxygen plasma treatment prior to film formation, or to adjust the film formation rate to a relatively slow rate, or to control the atmosphere during film formation to an oxygen atmosphere, or to adjust the film formation pressure to a relatively low level, etc. or combine two or more of these approaches.

Also, the oxygen partial pressure, the film formation pressure, and other such conditions during film formation by various methods can be varied.

Crystallinity can be made different by adjusting the various conditions during pretreatment or during film formation in order to improve adhesion in the region in contact with the active layer. For instance, the pretreatment duration can be shortened, the pressure of the gas during pretreatment can be lowered, or the microwave/RF power can be reduced. The conditions during film formation can be varied by adjusting the pressure of the gas during film formation, or the microwave/RF power.

The following method can be used to make the crystallinity different, so that bright and dark parts will be observed in the region in contact with the active layer under scanning transmission electron microscopy.

Just the active layer portion of the cavity end face is pretreated. The active layer portion of the cavity end face and the first nitride semiconductor layer and second nitride semiconductor layer portion are pretreated by different methods and/or under different conditions. A mask is provided to the active layer portion and a first protective film is formed on the first nitride semiconductor layer and second nitride semiconductor layer portion, after which a first protective film is formed on the active layer portion. Alternatively, the first protective films can be formed in the reverse order, among other methods.

When an oxide film is formed as the first protective film, using an oxide target is not the only option. Another method that may be utilized is to use a non-oxide target and sputter in an oxygen atmosphere or while irradiating oxygen gas, a plasma or the like. Also, when a nitride film is formed, one method that may be utilized is to use a non-nitride target and sputter in a nitrogen atmosphere or while irradiating nitrogen gas, a nitrogen plasma, or the like.

The nitride semiconductor layer of the laser element of the invention may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-side nitride semiconductor layer may doped with at least one n-type impurity of IV or VI group elements, such as Si, Ge, Sn, S, O, Ti, Zr, Cd etc. And the p-side nitride semiconductor layer may doped with at least one p-type impurity, such as Mg, Zn, Be, Mn, Ca, Sr etc. The doped concentration is preferably, for example, about $5 \times 10^{16}/cm^3$ to about $1 \times 10^{21}/cm^3$. All of layers in the n-type or p-type nitride semiconductor layers may not necessarily contain n-type or p-type impurity.

The nitride semiconductor layer may has a structure which is a SCH (Separate Confinement Heterostructure) wherein an optical waveguide is constituted by providing n-side and aside optical guide layers above and below the active layer. However, there is no particular restriction on these structures.

The active layer may be a multiple quantum well or single quantum well structure. Also, the active layer preferably has a narrower bandgap energy than the first protective film. With the present invention, setting the bandgap energy of the first protective film wider than that of the active layer widens the bandgap energy of the end face, or to put it another way, widens the impurity level near the end face of the cavity, and forms a window structure, and this in turn improves COD level.

A well layer and a barrier layer may include a layer having a general formula of $In_xAl_yGa_{1-x-y}N$ ($0 \leq x \leq 1$, $0 \leq y \leq 1$, $0 \leq x+y \leq 1$). It is preferably that at least well layer contains indium, and more preferably both the well layer and barrier layer contain indium. This tends to make easy formation of regions in which the crystallinity is different. It is preferable for the present invention because of improvement adhere with the first protective film and increase of the COD level.

If the active layer is formed as a multi quantum well structure containing indium, the region in which the crystallinity is different may be discontinuous or separated depends on the difference of indium mixing ratio.

In the nitride semiconductor laser element of the present invention may emits laser light with a wavelength of about 220 to 580 nm, it is possible to prevent separation of the first protective film and to improve COD level.

There is no particular restriction on a growth method of the nitride semiconductor layer, it can be formed by means of any known method which can grow these nitride semiconductor layers, such as MOCVD (Metal Organic Chemical Vapor Deposition), HVPE (Hydride Vapor Phase Epitaxy), MBE (Molecular Beam Epitaxy) or the like. In particular, MOCVD is preferable because it allows the nitride semiconductor to be growth with good crystallinity.

A cavity is formed along a ridge (discussed below) extending direction in the nitride semiconductor layer, and a pair of cavity end faces is formed in a direction perpendicular to the ridge extending direction. Examples of the cavity end face of the nitride semiconductor layer include orientation along the M axis, the A axis, the C axis, and the R axis. That is, it is a plane selected from the group consisting of the M plane (1-100), the A plane (11-20), the C plane (0001), and the R plane (1-102), with M axial orientation being particularly favorable. The "cavity end face" usually means a region including the above-mentioned region corresponding to the NFP (Near Field Pattern) or the optical waveguide region, but the cavity end face having this specific orientation may be at least a region other than the region corresponding to the NFP or the optical waveguide region. Also, the region corresponding to the NFP or the optical waveguide region may also have the above-mentioned orientation.

A ridge is formed on the surface of the p-side nitride semiconductor layer. The ridge functions as an optical waveguide, the width of the ridge may be from 1.0 to 30.0 μm, if the nitride semiconductor laser is used a light source of a single transverse mode, preferably from 1.0 to 3.0 μm. The height of the ridge (the etching depth) may be, for example, may be from 0.1 to 2 μm. The extent of optical confinement can be suitably adjusted by adjusting the thickness, material, and so on of the layer that makes up the p-side semiconductor layer. The ridge is preferably set so as to be 200 to 5000 μm of cavity length. The ridge need not be all the same width in the extension direction of the cavity, and its side faces may be vertical or may be tapered with an angle of about 45 to 90°.

The laser element of the invention is not necessarily formed the ridge, it may be a laser element having an electric current narrowing layer in the nitride semiconductor layers.

The nitride semiconductor layers are usually formed on a substrate. Such substrate may be an insulating substrate or a conductive substrate. The substrate is, for example, preferably a nitride semiconductor substrate having an off angle of no more than 10° and greater than 0° to the first main face and/or the second main face. The thickness of the substrate is at least 50 μm and no more than 10 mm, for example.

The nitride semiconductor substrate can be formed by a vapor phase growth method such as MOCVD, HVPE, MBE, or the like, a hydrothermal synthesis method in which crystals are grown in a supercritical fluid, a high pressure method, a flux method, a melt method, or the like. A commercially available substrate, any of the various known substrates disclosed, for instance, in Japanese Laid-Open Patent Application 2006-24703, or the like may be used.

Also, with the nitride semiconductor laser element of the present invention, a second protective films (see FIGS. 2, 26) with different film quality, material, or composition are preferably laminated over the first protective film. The second protective film may be a film composed of oxides of Si, Mg, Al, Hf, Nb, Zr, Sc, Ta, Ga, Zn, Y, B, Ti, etc., preferably be a film composed of $Al_2O_3$ or $SiO_2$, and more preferably a film with the same material as that of the first protective film. This reduces the generation of clack in the first and second protective films due to coincidence of thermal expansion coefficient between the first protective film and the second protective film.

The second protective film may be has any of single layer or laminated structure. The second protective film is formed from a single layer of Si or Al oxide, or a laminated structure of Si and Al oxides. Forming these films allows the first protective films to be affixed more securely to the cavity end face. As a result, stable operation is ensured, and COD level improves.

The second protective film is preferably formed as an amorphous film. Forming a film such as this prevents a change in the composition of the first protective film, and allows the first protective film to adhere more securely to the cavity end face. If the second protective film is formed from above the first protective film, which is formed from a material in a different state within the film, the above-mentioned stress-reduced state will be augmented, and the adhesion of the first protective film will be better. This prevents the separation of the first protective film as a whole.

The first protective film and second protective film were observed by STEM in a dark field at an acceleration voltage of 200 kV, which gave the STEM image shown in FIG. 3. In this image, the following were observed in increasing order of brightness: the second protective film 26, the region 25a in contact with the active layer, and the region 25 in contact with the first and second nitride semiconductor layers.

Figure 6A:
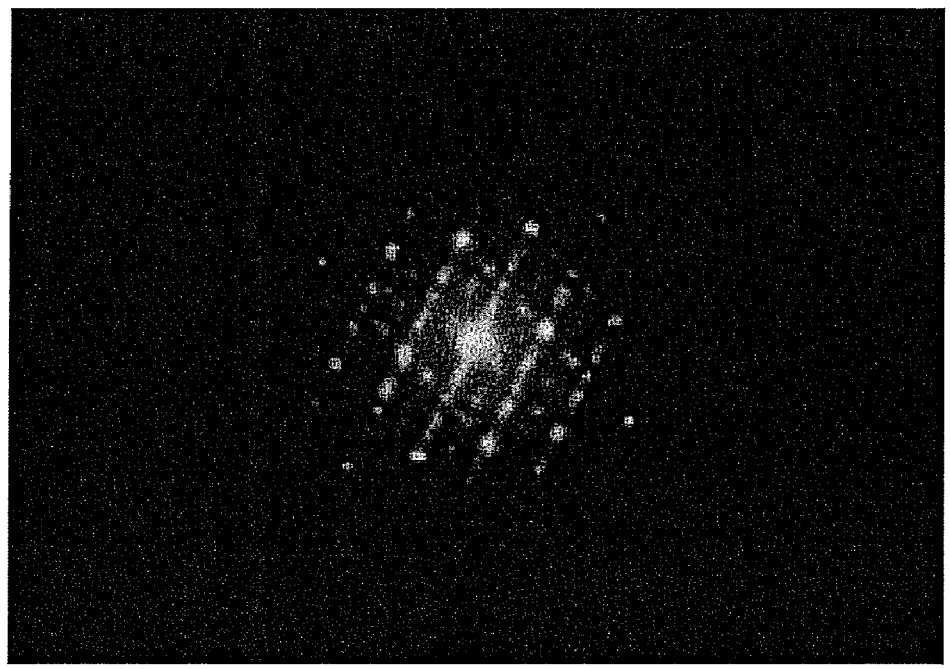
FIG. 6A is an electron beam diffraction image of the first protective film in contact with the first and second nitride semiconductor layers of the nitride semiconductor laser element of the present invention.
Figure 6B:
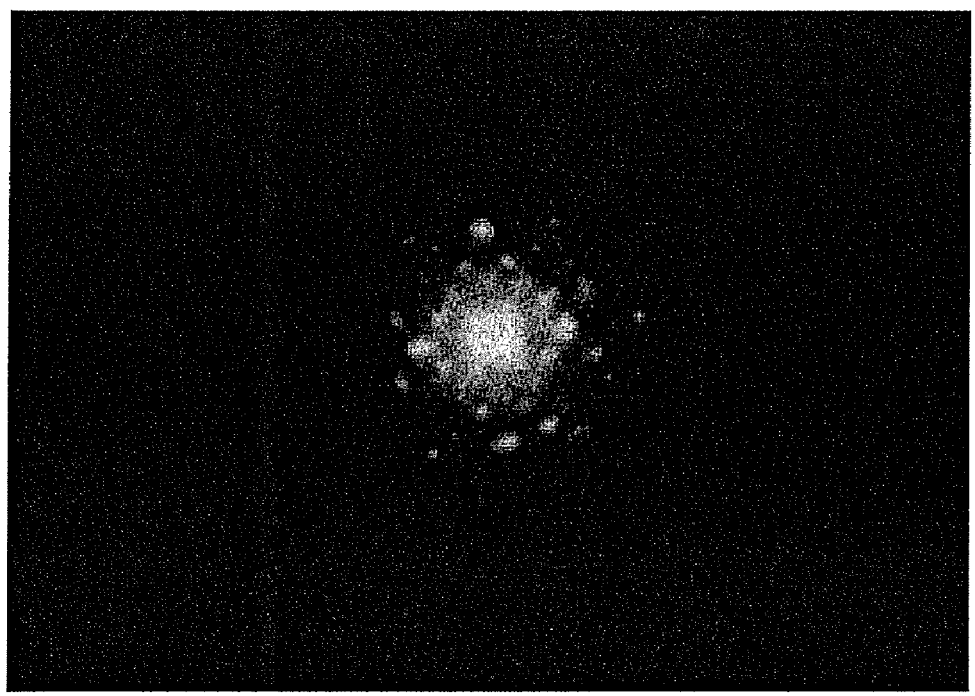
FIG. 6B is an electron beam diffraction image of the first protective film in contact with the active layer of the nitride semiconductor laser element of the present invention.
Figure 6C:
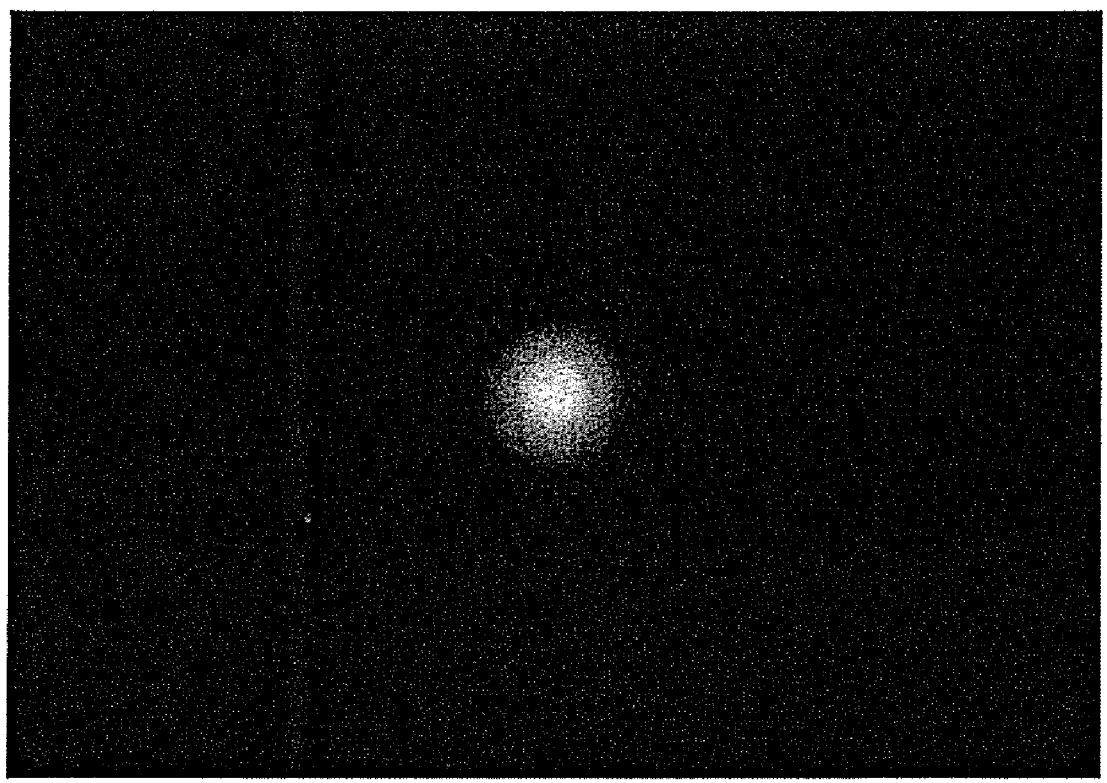
FIG. 6C is an electron beam diffraction image of the second protective film of the nitride semiconductor laser element of the present invention.

Also, an electron beam was directed from the GaN (11-20) plane direction and the electron beam diffraction image of the second protective film was observed, which revealed that there was no diffraction point in the diffraction image, as shown in FIG. 6C. It was confirmed from these observations that the second protective film was amorphous.

There are no particular restrictions on the thickness of the second protective film, but it should be thick enough to function as a protective film. This film thickness is preferably about 10 to 1500 nm. The combined thickness of the first protective film and second protective film is preferably about 2 μm or less.

The second protective film can be formed by any of the known methods listed as examples for the above-mentioned first film. In particular, it is preferably formed the second film as amorphous, although it will depend on the film formation method, to obtain such as this it is preferable to adjust the film formation rate to a relatively fast rate, or to control the atmosphere during film formation (to a oxygen atmosphere, for example), or to adjust the film formation pressure to a relatively high level, etc. Two or more of these methods may also be combined. When the oxygen atmosphere is controlled, oxygen is preferably introduced to the extent that there will be no absorption.

Both the first protective film and the second protective film may be formed not only on an exit side of the cavity end face, but also on a reflecting side, and the two may have different materials, film thicknesses, and so forth. Examples of the second protective film on the reflecting side include a laminated structure of a silicon oxide and a zirconium oxide; a laminated structure of an aluminum oxide and a zirconium oxide; a laminated structure of a silicon oxide and a titanium oxide; a laminated structure of an aluminum oxide, a silicon oxide, and a zirconium oxide; and a laminated structure of a silicon oxide, a tantalum oxide, and an aluminum oxide. The lamination period and so forth may be suitably adjusted according to the desired reflectance.

A film that is transmissive to the oscillation wavelength of the laser element is preferably formed as the outermost layer of the face protective films, such as the first protective film and second protective film formed on the cavity end face. Forming this outermost layer protects against moisture and air, and reduces separation of the first protective film and second protective film, and particularly separation of the outer film. The phrase "transmissive to the oscillation wavelength of the laser element" means that the film is formed from a material that does not absorb the oscillation wavelength of the laser element and in a thickness of $\lambda/2n$ ($\lambda$: oscillation wavelength, n: refractive index) or a multiple thereof.

Specific examples of materials that can form the outermost layer include oxides of aluminum or silicon. Using an oxide on the uppermost surface suppresses oxidation of the surface. For instance, when a protective film is provided as a laminated structure of an aluminum oxide and a zirconium oxide, if the zirconium oxide, which has high reflectance, is formed as the outermost layer, the zirconium oxide film will be prone to separating. However, separation of the protective film can be reduced if the outermost layer is a transmissive film composed of an oxide of silicon or aluminum and formed in the above-mentioned thickness.

The second protective film may partially cover a plane other than the cavity end face, just as with the first protective film. For example, when the second protective film is formed from the cavity end face to the semiconductor layer surface, optionally along with the first protective film, it is preferably formed at the corner thereof so that it has a different crystal plane from that of the cavity end face and the semiconductor layer surface. The result is that there is less local stress at the corner, where the protective film tends to separate, and stress is reduced between the cavity end face and the protective film, thereby preventing separation of the protective film. The second protective film may be formed, optionally along with the first protective film, so as to extend from the cavity end face to the back of the substrate (the opposite side from the side on which the nitride semiconductor layer is formed). Here again, it may have a different crystal plane between the cavity end face and the back of the substrate, just as in the case discussed above.

In the semiconductor laser element of the present invention, an embedded film is usually formed on the surface of the nitride semiconductor layer and to the side faces of the ridge. That is, the embedded film is above the nitride semiconductor layer, is in direct contact with the nitride semiconductor layer and an electrode (discussed below), and is formed in a region other than the region where an electrical connection is made. There are no particular restrictions on the position, size, shape, etc., of the region of connection between the nitride semiconductor layer and the electrode, but this region may, for example, be part of the surface of the nitride semiconductor layer, such as substantially the entire top face of the stripe-like ridge formed on the surface of the nitride semiconductor layer.

The embedded film is generally formed from an insulating material with a smaller refractive index than that of the nitride semiconductor layer. The refractive index can be measured using a polarizing ellipsometer (featuring ellipsometry), more specifically, it is, for example, HS-190 made by J. A. WOOLLAM and other ellipsometers. This embedded film is an insulator of a dielectric film of single layer or multilayer film composed of oxides, nitrides or oxide-nitrides of Zr, Si, V, Nb, Hf, Ta, Al, Ce, In, Sb, Zn and the like. The embedded film may have monocrystalline, polycrystalline or amorphous structure. If the embedded film is formed from the side faces of the ridge all the way to the surface of the nitride semiconductor on both sides of the ridge, it will ensure a refractive index difference versus the nitride semiconductor layer, and particularly the p-side semiconductor layer, which allows leakage of light from the active layer to be controlled, allows light to be confined efficiently within the ridge, and also better ensures insulation near the base of the ridge, so the generation of leak current can be avoided.

This embedded film can be formed by any method that is known in this field. For instance, a variety of methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and oxidation treatment (thermal treatment), or the like.

The electrodes of the present invention refers to a pair of electrodes electrically connected with the p- and n-side nitride semiconductor layers. The p-side electrode is preferably formed over the nitride semiconductor layer and the embedded film. Separation of the embedded film can be prevented by forming the electrode continuously over the embedded film and the nitride semiconductor layer that is the outermost layer. In particular, separation of the embedded film formed on the ridge side faces can be effectively prevented by forming the electrode up to the ridge side faces.

The p-side and n-side electrodes may preferably be formed with a single layer or laminated layer of a metal or metal alloy of palladium, platinum, nickel, gold, titanium, tungsten, copper, silver, zinc, tin, indium, aluminum, iridium, rhodium, ITO (Indium Tin Oxide) or the like. The electrodes are suitable formed in a thickness of, for example, about 50 to about 500 nm depend on the material used. The electrodes may be formed at least on the p-side semiconductor layer and the n-side semiconductor layer or the substrate, respectively, and further may be formed pad electrodes thereon with a conductive layer of a single layer or laminated layer. Also, the aside and n-side electrodes may be formed on the same side with respect to the substrate.

A third protective film 17 is preferably formed on the embedded film. This third protective film may be disposed over the embedded film on at least the surface of the nitride semiconductor layer, and preferably also covers the side faces of the nitride semiconductor layer and/or the side faces, surface, etc., of the substrate with or without the embedded film interposed therebetween. The third protective film can be formed from the same materials as those listed as examples for the embedded film. As a result, it is possible to ensure not only insulation reliably but also protection for the exposed side faces, surface, etc., of nitride semiconductor layer.

A p-side pad electrode is preferably formed from the side faces of the nitride semiconductor layer up to the top face of the embedded film 15, the p-side electrode and the third protective film.

The first and second protective films may be continuously formed from the cavity end faces to the top surface of the second nitride semiconductor layer. The first and/or second protective films formed on the nitride semiconductor layer surface may be away from, in contact with, or may cover the p-side electrode, the embedded film and p-side pad electrode. Preferably, the first and/or second protective film covers the embedded film and the aside electrode. This prevents peeling of the embedding film and the p-side electrode.

The thickness of the protective film formed on the second nitride semiconductor layer surface is preferably less than the thickness of the first and second protective films formed on the cavity end face. This prevents the protective film to generate clacks.

The protective film formed on the second nitride semiconductor layer surface is preferably oriented coaxially with the crystal plane of the nitride semiconductor layer, and C axis orientation is particularly favorable. This affords good adhesion between the protective film and the semiconductor layer surface.

Examples of the nitride semiconductor laser element of the present invention will now be described in detail through reference to the drawings, but the present invention is not limited to or by the following examples.

Example 1

As shown in FIGS. 1, 2A and 2B, the nitride semiconductor laser element of this Example comprises the first nitride semiconductor layer 11 (for example, n-side), the active layer 12, and the second nitride semiconductor layer 13 (for example, p-side) on the surface of which is formed the ridge 14, laminated in that order on the substrate 10 which is composed of GaN with a growing plane of the C plane, and a cavity of which has end faces of the M plane is formed.

With this nitride semiconductor laser element, a first protective film 25 and a second protective film 26 are formed on the end face of the cavity, and also an embedded film 15, a p-side electrode 16, an n-side electrode 19, a third protective film 17, p-side pad electrode 18 and the like are formed.

The end face of the cavity is formed by a nitride semiconductor layer having M axis orientation, and as shown in FIG. 2, the first protective film 25 is formed of a film oriented along the same axis as the end face of the cavity, namely, the M axis, and a second protective film 26, for at least one end face of the cavity.

The first protective film 25 is composed of $Al_2O_3$ and has a thickness of about 20 nm. The first protective film 25 is such that the region 25a is formed in contact with the active layer 12 in a region extending to the first nitride semiconductor layer 11 and a second nitride semiconductor layer 14 below and above the active layer 12.

This first protective film 25 observed by STEM in a dark field at an acceleration voltage of 200 kV, which gave the cross sectional S™ image shown in FIG. 3. The region 25a in contact with the active layer appears brighter (higher brightness) than the other regions, and it is visually apparent that the crystallinity thereof is different.

This first protective film 25 was measured by directing an electron beam from the GaN (11-20) plane direction at a camera length of 50 cm, and analyzed from the protective film surface side by electron beam diffraction, which gave the electron beam diffraction image shown in FIG. 6. In the region 25a in contact with the active layer, as shown in FIG. 6B, the points where atoms were present were indistinct. On the other hand, when another region of the first protective film 25 was analyzed, as shown in FIG. 6A, the points where atoms were present were seen distinctly, and it was found that they were more orderly than in the region 25a in contact with the active layer.

The second protective film 26 is composed of $Al_2O_3$ and has a thickness of about 100 nm. The first protective film 26 was analyzed from the second protective film surface side by electron beam diffraction, whereupon the points where atoms were present were almost impossible to discern, as shown in FIG. 6C.

This laser element can be manufactured by the following method.

First, a GaN substrate is provided. In a reaction vessel, a layer composed of $Al_{0.03}Ga_{0.97}N$ doped with Si at $4 \times 10^{18}/cm^3$ (2 μm thick) is grown on the substrate at a growth temperature of 1160° C. using trimethyl aluminum (TMA), trimethyl gallium (TMG) and ammonia ($NH_3$) as the raw material gas with a silane gas for an impurity gas. This n-side clad layer may be composed of a multilayer film (superlattice structure).

Next, the silane gas is stopped, and n-side wave guide layer composed of undoped GaN (0.175 μm thick) is grown at a growth temperature of 1000° C. This wave guide layer may be doped with n-type impurities.

The temperature is set to 900° C., a barrier layer composed of $In_{0.02}Ga_{0.98}N$ doped with Si (14 nm thick) and at same temperature, a well layer composed of undoped $In_{0.07}Ga_{0.93}N$ (7 nm thick) are laminated on the barrier layer. This process is repeated 2 times, finally the barrier layer is formed on the layers to grow an active layer composed of a multi quantum well structure (MQW) with a total thickness of 56 nm.

A p-side cap layer composed of $p-Al_{0.2}Ga_{0.7}N$ doped with Mg at $1 \times 10^{20}/cm^3$ (10 nm thick) is grown on the active layer using TMG, TMA, $NH_3$, and $Cp_2Mg$ (bis-cyclopentadienyl magnesium) at a growth temperature of 1000° C., which has a bandgap energy wider than the p-side wave guide layer as described below.

Next, $Cp_2Mg$ gas and TMA are stopped, and p-side wave guide layer composed of undoped GaN (0.145 μm thick) is grown at a growth temperature of 1000° C., which has a bandgap energy narrower than the p-side cap layer.

The temperature is set to 1000° C., and an A layer composed of undoped $Al_{0.10}Ga_{0.90}N$ (2.5 nm thick) is grown, and then TMA is stopped and $Cp_2Mg$ gas is used, a B layer composed of p-GaN (2.5 nm thick) is laminated. The A layer and the B layer are alternately laminated, and this process is repeated to grow an p-side clad layer composed of a superlattice structure with a total thickness of 0.45 μm.

Finally, a p-side contact layer composed of GaN doped with Mg at $1 \times 10^{20}/cm^3$ (15 nm thick) is grown on the p-side clad layer at a growth temperature of 1000° C.

The resulting wafer on which the nitride semiconductor has been grown is taken out of the reaction vessel, and a protective film composed of $SiO_2$ is formed as a stripe with a width (a length in a direction perpendicular to the end face of the cavity) of 800 μm on the surface of the p-side contact layer (the outermost layer). This portion will be main body of the cavity in the laser element. The cavity length may be preferably set to the range from 200 to 5000 μm.

Next, a $SiO_2$ protective film is formed as a stripe-shaped mask on the surface of the p-side contact layer, and RIE is performed using $SiCl_4$ gas. By these means, a stripe ridge waveguide region is formed.

Then, the sides of the ridge are protected by an embedded film composed of $ZrO_2$.

Next, a p-electrode composed of Ni (10 nm)/Au (100 nm)/Pt (100 nm) is formed on the surface overlying the p-side contact layer and the embedded film. After that, ohmic annealing is performed at 600° C. Subsequently, a third protective film composed of silicon oxide ($SiO_2$: 0.5 μm thick) is formed by sputtering on the p-electrode and the embedded film, and on the sides of the semiconductor layer.

Next, Ni (8 nm)/Pd(200 nm)/Au (800 nm) are formed continuously in this order on the exposed p-electrode that is not covered by the protective film, to produce a p-side pad electrode.

And then, the surface of the substrate which is opposite to the side growing the nitride semiconductor layers is polished so as to have a thickness of 80 μm.

An n-electrode composed of Ti (15 nm) or V (10 nm)/Pt (200 nm)/Au (300 mm) is formed on the polished surface of the substrate.

Next, recessed grooves are formed on the side of the first principal face of the substrate in a wafer state having the n-electrode, the p-electrode and the p-side pad electrode. These grooves is set to depth of 10 μm, the length of 50 μm in the direction parallel to the end faces of the cavity, from the side surface of the nitride semiconductor layer and the width of 15 μm in the direction perpendicular to the end feces. The cleaving is performed using the recessed grooves as a cleavage-assist grooves from the side of the substrate on which the n-electrode is formed to produce bars in which the cleavage faces ((1-100) plane, which is the plane corresponding to the lateral face of a hexagonal crystal, which is to say, the M plane) are the cavity end faces. The cavity length is set to 800 μm. After that, the bar is chipped in the direction perpendicular to the end faces of the cavity to be formed into a chip for a semiconductor laser element.

The end faces of the cavity of the obtained element is surface-treated with exposure to an oxygen plasma using a plasma treatment apparatus at a microwave/RF power of 500 W and an oxygen flow of 20 sccm for 10 minutes. And then the element is displaced in an ECR sputtering apparatus, a first protective film (20=m) which is composed of $Al_2O_3$ is formed at a microwave power of 500 W, an argon flow of 30 sccm, and an oxygen flow of 10 sccm using an Al target.

Next, on the first protective film formed on a light exit face of the cavity, an $Al_2O_3$ film is formed as a second protective film in a thickness of 100 nm with the ECR sputtering apparatus using an Al target, at a microwave/RF power of 500 W, an argon flow of 30 sccm, and an oxygen flow of 4 sccm.

And then, on the light reflecting side of the cavity, an $Al_2O_3$ film is formed as a first protective film in a thickness of 20 nm under the same condition as that of the film of the light exit face, and an $Al_2O_3$ film is formed as a second protective film in a thickness of 40 nm, further $SiO_2/ZrO_2$ films are formed in the thickness of 67 nm/44 nm with six cycle repetition thereon.

For the sake of comparison, a laser element was formed by substantially the same manufacturing method as the above-mentioned semiconductor laser element, except that a single-layer protective film composed of $Al_2O_3$ was formed in a thickness of 120 nm, without undergoing pretreatment with an oxygen plasma, but without changing any of the other conditions.

TABLE 1

|  | First Protective Film | Second Protective Film |
|---|---|---|
| Ex. 1 | $Al_2O_3$: 20 nm | $Al_2O_3$: 100 nm |
| Comp. Ex. | $Al_2O_3$: 120 nm | — |

The current-optical output characteristics after continuous oscillation were measured for the semiconductor laser element thus obtained, and the COD level was evaluated.

Figure 4:
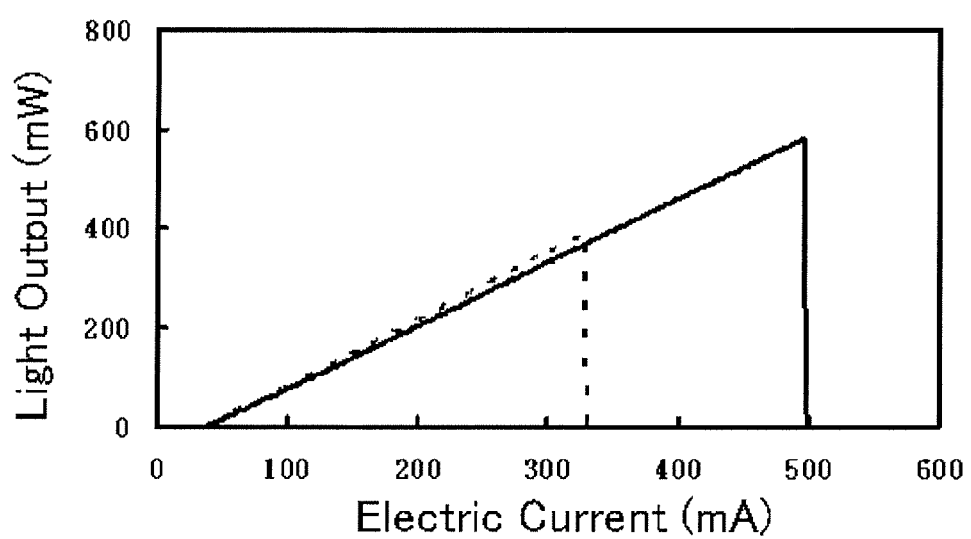
FIG. 4 is a graph showing the relation of light output and electric current.

These measurement results are given in FIG. 4.

The data indicated by the solid line show the current-optical output characteristics of the laser element of the present invention, which had a first protective film with a different in-plane crystallinity, and the data indicated by the dotted line show the current-optical output characteristics of a laser element that had a first protective film with a substantially the same in-plane crystallinity (comparative example). On the curve of current-optical output characteristics, optical output increases along with the injected current, and when the optical output reaches the COD level, the facet is destroyed and laser oscillation stops.

It can be seen from FIG. 4 that the COD level of the laser element equipped with the protective film of the present invention was far higher than that of the comparative example.

Thus, the formation of the protective film in which the crystallinity is different in the region in contact with the active layer will produce less stress around the light emitting part of the nitride semiconductor layer at the cavity end face, produce less clack, will adhere well to the cavity end face, and also prevents separation. As a result, it is possible to increase COD level.

Also, to test the protective film of the nitride semiconductor laser element thus obtained, a chip on which a protective film had been formed by the same method as above was immersed in buffered hydrofluoric acid composed of ammonium fluoride and 15.7% hydrofluoric acid, and the dissolution of the protective film was observed. As a result, it was found that the protective film in the region in contact with the active layer completely dissolved in substantially the thickness direction within five minutes after being immersed, whereas the protective film in the region in contact with the first and second nitride semiconductor layers was not removed, although it did dissolve or swell somewhat on the surface.

Examples 2 to 9

In these Examples, laser elements were produced in the same manner as in Example 1, except that the materials and thicknesses of the first protective film and second protective film were changed, and surface treatment was performed using an oxygen plasma when the first protective film was an oxide film, and using a nitrogen plasma when it was a nitride film.

The first protective film and the second protective film has composition and film thickness shown in the following table 2. A Ni-base p-side electrode and Ti-base n-side electrode is used for Example 2 to 5, and a Ni-base p-side electrode and V-base n-side electrode is used for Example 6 to 9.

TABLE 2

|  | First Protective Film | Second Protective Film |
|---|---|---|
| Ex. 2 | $Al_2O_3$: 10 nm | $SiO_2$: 135 nm |
| Ex. 3 | AlN: 20 nm | $SiO_2$: 130 nm |
| Ex. 4 | $Al_2O_3$: 32 nm | $SiO_2$: 110 nm |
| Ex. 5 | GaO: 20 nm | $SiO_2$: 130 nm |
| Ex. 6 | $Al_2O_3$: 20 nm | $Al_2O_3$: 130 nm |
| Ex. 7 | AlN: 32 nm | $SiO_2$: 260 nm |
| Ex. 8 | $Al_2O_3$: 50 nm | $Al_2O_3$: 100 nm |
| Ex. 9 | $Al_2O_3$: 70 nm | $Al_2O_3$: 80 nm |

These laser elements were evaluated in the same manner as in Example 1. The COD level increased and the service life was good in these Examples in the same manner as in Example 1.

Example 10

In the Examples, on a first protective film (20 nm) of $Al_2O_3$ formed on the light exit end face, a second protective film (40 nm) of $Al_2O_3$ is formed, $Al_2O_3/ZrO_2$ (60 nm/43 nm) films are formed with two cycle repetition thereon, finally $Al_2O_3$ (120 nm) film is formed.

Also, on the refraction end face, $Al_2O_3/ZrO_2$ (60 nm/43 nm) films are formed with six cycle repetition, finally $Al_2O_3$ (120 nm) film is formed.

The laser elements were produced in the same manner as in Example 1 other than the above.

With these laser elements, the $ZrO_2$, which has high reflectance, formed on the exit side tends to separate, but it was made less likely to separate by forming $Al_2O_3$ over it as the outermost layer. This allowed a laser element with stable operation to be obtained, and the COD was increased just as in Example 1, and the service life was good.

The present invention can be applied to a wide range of nitride semiconductor elements with which the protective film needs to adhere well to the semiconductor layer, such as in use as light emitting elements (e.g., LD, LED, super luminescence diode, etc.), solar cells, light-receptive elements (e.g., light sensor, etc.), electric devices (e.g., transistor, power device, etc.) and the like. In particular, it is useful as nitride semiconductor elements in optical disk applications, optical communications systems, printers, optical exposure applications, and various devices for measurement, excitation light source for bio-specific applications and the like.

This application claims priority to Japanese Patent Application Nos. 2007-151636 and 2008-124130. The entire disclosure of Japanese Patent Application Nos. 2007-151636 and 2008-124130 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A nitride semiconductor laser element comprising:
   a nitride semiconductor layer that includes a first nitride semiconductor layer, an active layer, and a second nitride semiconductor layer, and that has a cavity with end faces, and
   a first protective film that is substantially in contact with at least one end face of the cavity, the first protective film having a film structure in which bright and dark parts including a region substantially in contact with the active layer and a region substantially in contact with the first nitride semiconductor layer and the second nitride semiconductor layer are observed under scanning transmission electron microscopy, the regions with the bright and dark parts of the first protective film overlapping each other as viewed in a lamination direction of the first nitride semiconductor layer, the active layer and the second nitride semiconductor layer, the bright or dark part of the region substantially in contact with the active layer being disposed continuously in the thickness direction of the first protective film.

2. The element according to claim 1, wherein the first protective film has the thickness of 3 nm to 1000 nm.

3. The element according to claim 1, wherein the first protective film is formed of a material having a hexagonal system crystal structure.

4. The element according to claim 3, wherein the first protective film has a crystal structure with the same axial orientation as the cavity end face in the region substantially in contact with the first nitride semiconductor layer and the second nitride semiconductor layer.

5. The element according to claim 1, wherein the first protective film is covered with a second protective film.

6. The element according to claim 5, wherein the second protective film has the thickness of 10 nm to 1500 nm.

7. The element according to claim 5, wherein scanning transmission electron microscopy reveals higher or lower brightness in the second protective film, the region substantially in contact with the active layer, and the region substantially in contact with the first and second nitride semiconductor layers in this order.

8. The element according to claim 1, wherein the bright or dark part of the region substantially in contact with the active layer is wider on the outside of the element than on the cavity end face side.

9. A nitride semiconductor laser element comprising:

a nitride semiconductor layer that includes a first nitride semiconductor layer, an active layer, and a second nitride semiconductor layer, and that has a cavity with end faces, and a first protective film that is in contact with at least one end face of the cavity, the first protective film having a film structure in which bright and dark parts comprising a region in contact with the active layer and a region in contact with the first nitride semiconductor layer and the second nitride semiconductor layer are observed under scanning transmission electron microscopy, the bright or dark part of the region in contact with the active layer being wider on the outside of the element than on the cavity end face side.

10. A nitride semiconductor laser element comprising:

a nitride semiconductor layer that includes a first nitride semiconductor layer, an active layer, and a second nitride semiconductor layer, and that has a cavity with end faces, and a first protective film that is in contact with at least one end face of the cavity, wherein the first protective film has a film structure in which bright and dark parts comprising a region in contact with the active layer and a region in contact with the first nitride semiconductor layer and the second nitride semiconductor layer are observed under scanning transmission electron microscopy, the first protective film being covered with a second protective film, and scanning transmission electron microscopy reveals higher or lower brightness in the second protective film, the region in contact with the active layer, and the region in contact with the first nitride semiconductor layer and the second nitride semiconductor layer in this order.

11. A nitride semiconductor laser element comprising:

a nitride semiconductor layer that includes a first nitride semiconductor layer, an active layer, and a second nitride semiconductor layer, and that has a cavity with end faces, and a first protective film that is substantially in contact with at least one end face of the cavity, the first protective film having a film structure in which the crystallinity at a portion adjacent to the active layer is different from that at portions adjacent to the first nitride semiconductor layer and the second nitride semiconductor layer as the crystallinity changes in regions between the portion adjacent to the active layer and the portions adjacent to the first nitride semiconductor layer and the second nitride semiconductor layer along a lamination direction of the first nitride semiconductor layer, the active layer and the second nitride semiconductor layer.

12. The element according to claim 11, wherein the portions adjacent to the first nitride semiconductor layer and the second nitride semiconductor layer have better crystallinity than the portion adjacent to the active layer.

13. The element according to claim 11, wherein the portion adjacent to the active layer has substantially the same crystallinity in the thickness direction of the first protective film.

14. The element according to claim 13, wherein the portion adjacent to the active layer having substantially the same crystallinity is wider on the outside of the element than on the cavity end face side.

15. The element according to claim 11, wherein the first protective film has the thickness of 3 nm to 1000 nm.

16. The element according to claim 11, wherein the first protective film is formed of a material having a hexagonal system crystal structure.

17. The element according to claim 11, wherein the first protective film is covered with a second protective film.

18. The element according to claim 17, wherein the second protective film has the thickness of 10 nm to 1500 nm.

19. The element according to claim 17, wherein the crystallinity is better at the portions adjacent to the first and second nitride semiconductor layers, the portion adjacent to the active layer, and the second protective film, in this order.

20. A nitride semiconductor laser element comprising:

a nitride semiconductor layer that includes a first nitride semiconductor layer, an active layer, and a second nitride semiconductor layer, and that has a cavity with end faces, and a first protective film that is in contact with at least one end face of the cavity, the first protective film having a film structure in which the crystallinity at a portion adjacent to the active layer is different from that at portions adjacent to the first nitride semiconductor layer and the second nitride semiconductor layer, the portion adjacent to the active layer having substantially the same crystallinity in the thickness direction of the first protective film, the portion adjacent to the active layer having substantially the same crystallinity being wider on the outside of the element than on the cavity end face side.

21. A nitride semiconductor laser element comprising:
a nitride semiconductor layer that includes a first nitride semiconductor layer, an active layer, and a second nitride semiconductor layer, and that has a cavity with end faces; and
a first protective film that is in contact with at least one end face of the cavity; and
a second protective film formed on the first protective film,
the first protective film having a film structure in which the crystallinity at a portion adjacent to the active layer is different from that at portions adjacent to the first nitride semiconductor layer and the second nitride semiconductor layer,
the crystallinity being better at the portions adjacent to the first and second nitride semiconductor layers, the portion adjacent to the active layer, and the second protective film, in this order.

* * * * *